United States Patent [19]
McCulloch et al.

[11] Patent Number: 6,080,236
[45] Date of Patent: Jun. 27, 2000

[54] ELECTRONIC DEVICE MANUFACTURE

[75] Inventors: David J. McCulloch, Redhill; Stanley D. Brotherton, Forest Row, both of United Kingdom

[73] Assignee: U.S. Philips Corporation, New York, N.Y.

[21] Appl. No.: 08/975,525

[22] Filed: Nov. 20, 1997

[30] Foreign Application Priority Data

Nov. 28, 1996 [GB] United Kingdom .................... 9624715

[51] Int. Cl.$^7$ ...................................................... C30B 1/06
[52] U.S. Cl. .............................. 117/4; 117/904; 117/930; 117/200; 427/8; 427/10; 427/554; 427/539; 438/16
[58] Field of Search ................................. 117/4, 200, 930, 117/904; 427/8, 10, 554, 539; 438/16

[56] References Cited

U.S. PATENT DOCUMENTS

| | | | |
|---|---|---|---|
| 4,403,318 | 9/1983 | Nagashima et al. | 369/100 |
| 4,909,630 | 3/1990 | Gawrisch et al. | 356/364 |
| 5,049,816 | 9/1991 | Moslehi | 324/767 |
| 5,086,430 | 2/1992 | Kapon et al. | 372/50 |
| 5,130,829 | 7/1992 | Shannon . | |
| 5,372,836 | 12/1994 | Imahashi . | |
| 5,459,321 | 10/1995 | Bartoli et al. | 250/370.13 |
| 5,659,390 | 8/1997 | Danko | 356/237.4 |

OTHER PUBLICATIONS

"Surface Roughness Effects in Laser Crystallized Polycrystalline Silicon", DJ McCulloch et al, Appl. Phys. Lett. 66(16), Apr. 17, 1995; pp. 2060–2062.

"Beam Shape Effects With Excimer Laser Crystallisation of Plasma Enhanced and Low Pressure Chemical Vapor Deposited Amorphous Silicon", Solid State Phenomena vols. 37–38 (1994); pp. 299–304.

Ebihora et al., "Photocrystallization of Amorphous Silicon by Incoherent Radiation", Proc. Electrochem Soc (82–8) pp. 488–495 Abs, 1982.

*Primary Examiner*—Robert Kunemund
*Attorney, Agent, or Firm*—Brian J. Wieghaus

[57] ABSTRACT

The invention provides a method of manufacturing a large-area electronic device, for example a flat panel display, comprising thin-film circuit elements, and also laser apparatus for crystallizing a portion of a semiconductor thin-film (1) with a beam (11) of set energy. The energy of the beam (11) is set in accordance with the output from a light detector (22) to regulate the crystallization of a device portion (3,4 and/or 5) of a semiconductor thin film (1) at which the beam (11) is subsequently directed with its set energy. The light detector (22) monitors the surface quality of a previously crystallized portion (2). In accordance with the present invention, the light detector (22) is located at a position outside the specular reflection path (25) of the light returned by the surface area of the crystallized portion (2) and detects a threshold increase (D) in intensity ($I_s$) of the light (26) being scattered by the surface area of the crystallized portion. This threshold increase (D) occurs when the energy ($E_p$) of the beam (11) is increased sufficiently to cause the onset of surface roughening.

19 Claims, 3 Drawing Sheets

ELECTRONIC DEVICE MANUFACTURE

BACKGROUND OF THE INVENTION

This invention relates to methods of manufacturing electronic devices comprising a thin-film circuit element, including the step of directing an energy beam at a surface of a semiconductor thin film to crystallise at least a portion of the thin film. The device may be a flat panel display (for example, a liquid crystal display), or a large area image sensor or several other types of large-area electronic device (for example, a thin-film data store or memory device). The invention also relates to apparatus for crystallising a portion of a semiconductor thin film.

There is much interest in developing thin-film circuits with thin-film transistors (hereinafter termed TFTs) and/or other semiconductor circuit elements on insulating substrates for large-area electronics applications. These circuit elements fabricated with portions of an amorphous or polycrystalline semiconductor film may form the switching elements in a cell matrix, for example in a flat panel display as described in U.S. Pat. No. 5,130,829 (our reference PHB 33646), the whole contents of which are hereby incorporated herein as reference material.

Recent developments involve the fabrication and integration of thin-film circuits (usually with polycrystalline silicon) as, for example, integrated drive circuits for such a cell matrix. In order to increase the circuit speed, it is advantageous to use semiconductor material of good crystal quality and high mobility for thin-film islands of the TFTs of these circuits. It is known to deposit a semiconductor thin film of amorphous material or of low crystallinity material and then to form the material of high crystallinity in at least a device portion of this film by exposure to an energy beam from a laser.

U.S. Pat. No. 5,372,836 discloses a method of manufacturing an electronic device comprising a thin-film circuit element, which method includes the steps of:

(a) directing an energy beam at a surface area of a semiconductor thin film on a substrate to crystallise at least a portion of the thin film, (b) monitoring the surface quality of the crystallised portion of the thin film by directing light at the surface area of the crystallised portion and by detecting with a light detector the light returned from the surface area, the light detector giving an output indicative of the monitored surface quality, and (c) setting the energy of the beam in accordance with the output from the light detector to regulate the crystallisation of a device portion of a semiconductor thin film at which the beam is subsequently directed with its set energy.

The whole contents of U.S. Pat. No. 5,372,836 are hereby incorporated herein as reference material.

In the method and apparatus described in U.S. Pat. No. 5,372,836 the light detector is a spectroscope 16. The light source 17 for directing the light at the surface area of the crystallised thin-film portion has a wide wavelength band from 200 nm to 500 nm. The spectroscope 16 is located in the specular reflection path of the light returned by the surface area of the film. Sample outputs of the spectroscope 16 are depicted as graphs in FIGS. 18 to 21 of U.S. Pat. No. 5,372,836, showing the bandgap spectral reflectance of a film in various crystallisation states. The spectral reflectance shown in these graphs are for a polycrystalline silicon film in an ideal state in FIG. 18, for an amorphous silicon film in FIG. 19, for an amorphous silicon film insufficiently transformed into polycrystalline silicon in FIG. 20 due to an insufficient energy of the laser beam, and for a film damaged by an excessive energy of the laser beam in FIG. 21.

In the method described in U.S. Pat. No. 5,372,836, the semiconductor thin film is deposited on the substrate as hydrogenated amorphous silicon material by a plasma CVD (chemical vapour deposition) process. The device portion of the film is subjected to multiple exposures with the laser beam, the energy of the laser beam being progressively increased with each exposure. Initially, the energy levels of the laser beam are set such that hydrogen is gradually discharged from the film without crystallising or damaging the film. The energy of the beam is finally set such that the film is transformed into a polycrystalline silicon material. The spectroscope 16 provides a good source of information on the quality of the exposed film portion at the different stages.

As can be seen from FIGS. 18 to 20 of U.S. Pat. No. 5,372,836, such an arrangement with specular reflection to a spectroscope can provide a good indication of whether the film is still inadequately crystallised so enabling increased crystallisation of the film to be carried out by a further exposure with an increased beam energy. As shown in FIG. 21, such an arrangement is also good for detecting when an excessive energy level has been used and has damaged the film. However, as described in column 13, lines 12 to 15, when the spectroscopic reflectance distribution shown in FIG. 21 is detected, the sample is a defective one. It is then too late to remedy the situation, and the sample can only be discarded as being defective.

SUMMARY OF THE INVENTION

It is an aim of the present invention to provide a different light detection arrangement which provides an indication of a threshold change in monitored surface quality of the thin film prior to the occurrence of such damage, and so permits the use of a high beam energy in order to provide crystallised semiconductor material of good crystal quality and high mobility.

According to a first aspect of the present invention there is provided a method of manufacturing an electronic device comprising a thin-film circuit element, which method includes the steps of:

(a) directing an energy beam at a surface area of a semiconductor thin film on a substrate to crystallise at least a portion of the thin film, (b) monitoring the surface quality of the crystallised portion of the thin film by directing light at the surface area of the crystallised portion and by detecting with a light detector the light returned by the surface area, the light detector giving an output indicative of the monitored surface quality, and (c) setting the energy of the beam in accordance with the output from the light detector to regulate the crystallisation of a device portion of a semiconductor thin film at which the beam is subsequently directed with its set energy, characterised in that the light detector is located at a position outside the specular reflection path of the light returned by the surface area of the crystallised portion and detects a threshold increase in intensity of the light being scattered by the surface area of the crystallised portion, which threshold increase occurs when the energy of the beam is increased sufficiently to cause an onset of surface roughening, and in that, when crystallising the device portion for the thin-film circuit element during the step (c), the energy of the beam is set to a value as determined by the detection of said threshold increase.

The present invention utilises a discovery by the present inventors that, as the beam energy is increased, there is an onset of surface roughening which occurs before the thin film is damaged by an excessive energy level. The onset of surface roughening seems to relate to a sudden appearance of a spatially periodic perturbation (ripples) in the crystallised semiconductor material as described in the article "Surface roughness effects in laser crystallised polycrystalline silicon" by the present inventors, published in Applied Physics Letters, Vol 66, No 16, Apr. 17, 1995, pages 2060 to 2062, the whole contents of which are incorporated herein as reference material. this onset of surface roughening precedes an increase in grain size which occurs as melt-through of the film is approached, i.e when the absorbed energy of the beam in the film is sufficient to form a molten zone which reaches through most of the thickness of the film to the substrate. The present inventors find that this particular onset of surface roughening cannot be detected with adequate sensitivity using specularly reflected light. However, an arrangement in accordance with the present invention which detects light scattered by the crystallised surface area is able to detect the particular onset of surface roughening and has sufficient sensitivity for reliable and accurate detection in a manufacturing situation. Thus, the present invention permits detection of this onset of surface roughening to be used to set the beam energy for a large-grain high-mobility crystal state of the thin film.

Thus, the present invention permits the energy of the beam to be increased to a value (as reliably determined by the detection of this threshold increase in scattered light) for producing large-grain good-quality high-mobility crystal material, below an excessive energy level associated with damage to the film. Good quality crystallised film portions with electron mobilities in excess of $100 \text{ cm}^2 \cdot \text{V}^{-1} \cdot \text{s}^{-1}$ can be reliably obtained in accordance with the present invention. Generally speaking, the optimum beam energy for maximum film mobility does not coincide with the energy at which the onset of this surface roughening occurs as detected by said threshold increase in scattered light, but occurs at a slightly higher energy. Thus, for maximum film mobility, the energy of the beam is set to a value of (E+dE), where E is the energy at which this particular onset of surface roughening is detected and dE is a small incremental increase (for example 10 to 60 $\text{mJ} \cdot \text{cm}^{-2}$) for typical thicknesses of the thin film required for most circuit elements of large area electronic devices. The value of dE increases with increasing values of E, as described hereinafter.

In a batch manufacturing process where a batch of thin films on substrates are crystallised with the energy beam, the energy of the beam may be set to an operational value when processing a first substrate in the batch, and this operational value may then be used for subsequent substrates in the batch. However, it is advantageous to monitor the surface quality and so to regulate the energy value of the beam for each substrate in the batch. Thus, the present inventors find that the threshold increase in scattered light intensity occurs at an energy value E which is dependent on the thickness of the thin film.

The present invention permits the energy value of the beam to be set in accordance with the actual thickness of the film of any given sample, so that the energy value can be set for each sample. Thus, the portion crystallised in step (a) for monitoring in step (b) may be a part of the same semiconductor thin film as the device portion subsequently crystallised with the beam of set energy in step (c). The device portion of the thin film may be a separate area from a test surface area of the film where the monitoring of step (b) is carried out. Thus, a method in accordance with the present invention may be further characterised by the steps of directing the energy beam at a test surface area of the semiconductor film in step (a), setting the energy of the beam to the set value by monitoring the quality of the crystallised test surface area by means of the scattered light in step (b), and directing the energy beam with the set value of energy at a different surface area of the same semiconductor thin film to crystallise the device portion for the thin-film circuit element. It is convenient to provide the test area as a peripheral area of the semiconductor thin film. Thus, the energy beam may first be scanned along the test area to regulate its energy, after which it may be scanned along the device area with the set value.

According to a second aspect of the present invention there is provided apparatus for crystallising a portion of a semiconductor thin film on a substrate comprising a laser for generating an energy beam to crystallise the portion of the thin film, a processing cell containing a support for mounting the substrate, an optical system between the laser and the processing cell to direct the beam from the laser at a surface area of the thin film when the substrate is mounted in the processing cell, adaptor means for changing the energy of the beam incident on the film, a light source for directing light at the surface area of the crystallised portion of the thin film, and a light detector for detecting the light returned by the surface area, the light detector giving an output indicative of the surface quality, characterised in that the light detector is located at a position outside the specular reflection path of the light returned by the surface area of the crystallised portion and has sufficient sensitivity to detect a threshold increase in intensity of the light being scattered by the surface area of the crystallised portion, which threshold increase occurs when the energy of the beam is increased sufficiently to cause the onset of surface roughening, and control means take an input from the output of the light detector and provide an output to the adaptor means for setting the energy of the beam to a value as determined by the detection of said threshold increase.

Preferably the energy of the beam is adjusted to the set value by means of an attenuator or other optical element which is located in the path of the beam, and which forms part of the optical system between the laser and the processing cell. Using an optical element as the adaptor means is more preferable than adjusting the electrical power supply to the laser, because adjustment of the laser itself via the power supply during operation tends to cause instability.

The scattered light which is detected may be directed at the surface area of the crystallised portion from a light source independent of the beam used for crystallising the thin-film portion. However, the beam used for crystallising the thin-film portion may be generated by a laser, and this laser and its generated beam may also provide the light which is scattered to the light detector for monitoring the surface quality in step (b) of the method.

BRIEF DESCRIPTION OF THE DRAWINGS

These and other features in accordance with the present invention, and their advantages, are illustrated specifically in embodiments of the invention now to be described, by way of example, with reference to the accompanying diagrammatic drawings, in which.

Figure 1:
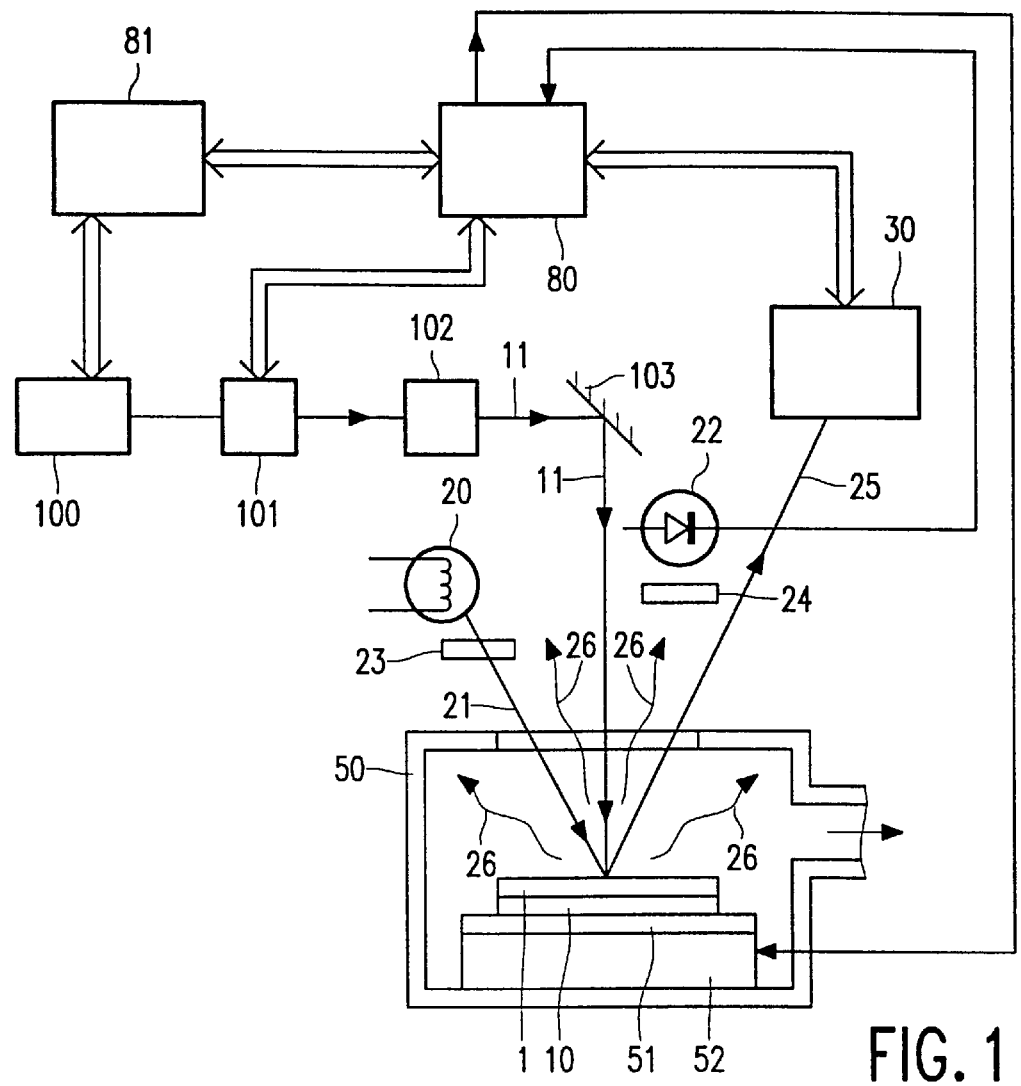
FIG. 1 is a schematic of laser apparatus in accordance with the present invention and suitable for use in a manufacturing method also in accordance with the present invention.

It should be noted that FIGS. 1 to 4 are diagrammatic and not drawn to scale. Relative dimensions and proportions of parts of these Figures have been shown exaggerated or reduced in size, for the sake of clarity and convenience in the drawings. The same reference signs are generally used to refer to corresponding or similar features in different embodiments.

DETAILED DESCRIPTION OF THE PREFERRED EMBODIMENTS

Figure 2:
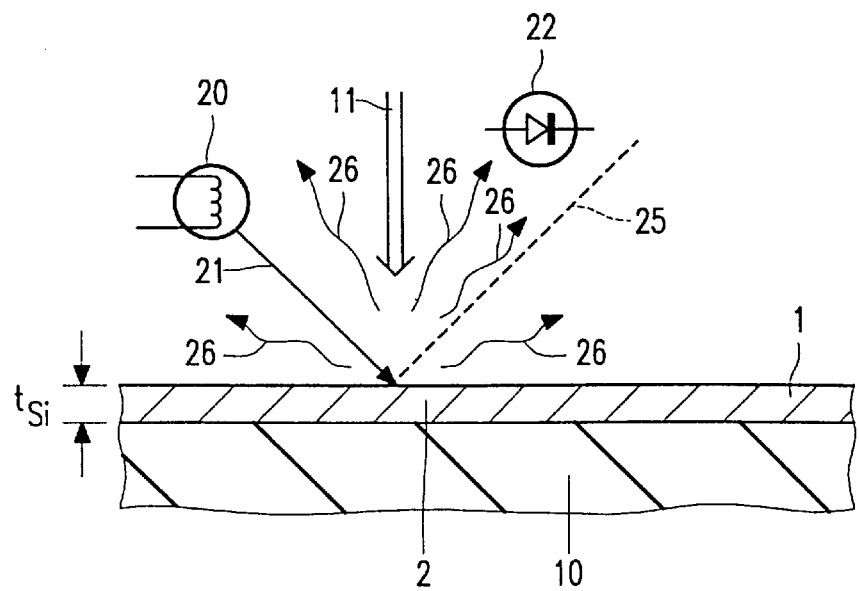
FIG. 2 is a schematic cross-sectional view of a semiconductor thin film on a substrate during the manufacture of an electronic device in accordance with the present invention.
Figure 3:
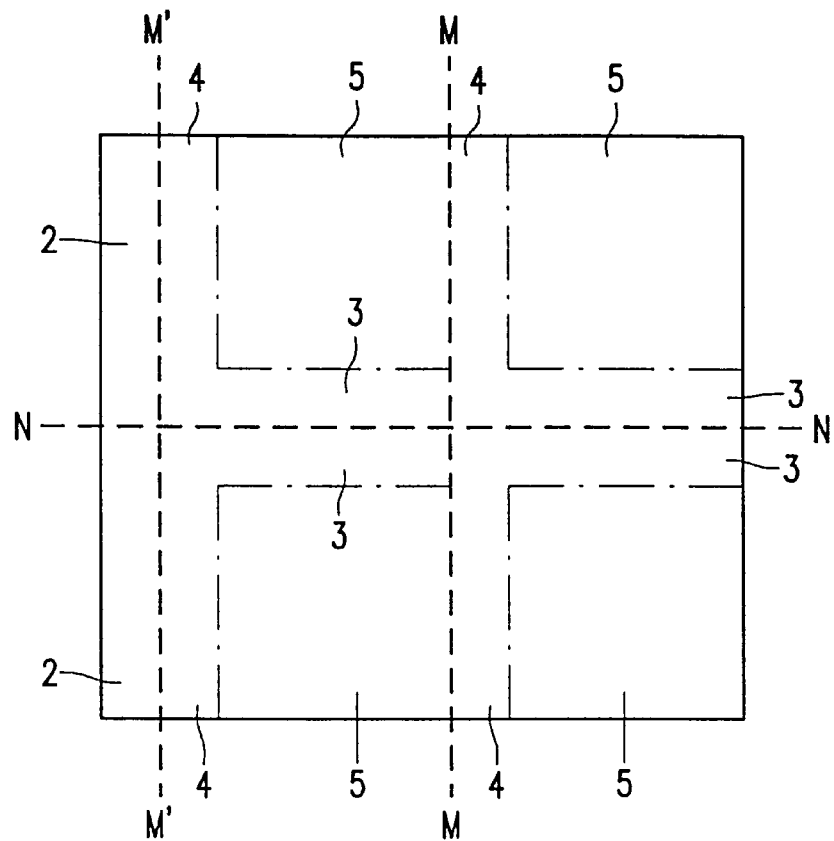
FIG. 3 is a plan view of different areas of the semiconductor film of the FIG. 2.

As illustrated by examples in FIGS. 1 to 3, the present invention provides both a method of manufacturing a large-area electronic device (for example a flat panel display similar to that disclosed in U.S. Pat. No. 5,130,829) and also apparatus for crystallising a portion of a semiconductor thin film 1 in such a method.

The method includes the steps of:

(a) directing an energy beam 11 at a surface area of a semiconductor thin film 1 on a substrate 10 to crystallise at least a portion 2 of the thin film 1 (FIG. 2), (b) monitoring the surface quality of the crystallised portion 2 of the thin film 1 by directing light 21 at the surface area of the crystallised portion 2 and by detecting with a light detector 22 the light returned by the surface area, the light detector 22 giving an output indicative of the monitored surface quality (FIGS. 1 and 2), and (c) setting the energy of the beam 11 in accordance with the output from the light detector 22 to regulate the crystallisation of a device portion 3,4 and/or 5 of a semiconductor thin film 1 at which the beam 11 is subsequently directed with its set energy (FIGS. 1 and 3).

In accordance with the present invention, the light detector 22 is located at a position outside the specular reflection path 25 of the light returned by the surface area of the crystallised portion and detects a threshold increase (D in FIG. 6) in intensity $I_s$ of the light 26 being scattered by the surface area of the crystallised portion, which threshold increase D occurs when the energy $E_p$ of the beam 11 is increased sufficiently to cause the onset of surface roughening, and in that, when crystallising the device portion 3,4 and/or 5 for a thin-film circuit element (for example a polycrystalline silicon TFT) during the step (c), the energy of the beam 11 is set to a value as determined by the detection of said threshold increase D.

The apparatus, as illustrated in FIG. 1 comprises a laser 100 for generating the energy beam 11 to crystallise the portion of the thin film 1; a processing cell 50 containing a support 51 for mounting the substrate 10; an optical system 101 to 103 between the laser 100 and the processing cell 50 to direct the beam 11 from the laser 100 at a surface area of the thin film 1 when the substrate 10 is mounted in the processing cell 50; and adaptor means 81,101 for changing the energy of the beam 11 incident on the film 1; a light source 20 for directing light 21 at the surface area of the crystallised portion 2 of the thin film 1, and a light detector 20 for detecting the light returned by the surface area, the light detector 20 giving an output indicative of the surface quality.

In accordance with the present invention, the light detector 22 is located at a position outside the specular reflection path 25 of the light returned by the surface area of the crystallised portion 2 and has sufficient sensitivity to detect a threshold increase D in intensity $I_s$ of the light 26 being scattered by the surface area of the crystallised portion, which threshold increase D occurs when the energy of the beam 11 is increased sufficiently to cause the onset of surface roughening, and control means 80 couple the light detector 22 to the adaptor means 81,101 to take an input from the output of the light detector 22 and to provide an output control signal to the adaptor means 81,101 for setting the energy of the beam 11 to a value as determined by the detection of said threshold increase D.

Preferably a pulsed laser beam 11 of an ultraviolet wavelength is used, generated by an excimer laser 100. A laser beam 11 of ultraviolet wavelength has the known advantage of permitting control of its absorption depth in the semiconductor material of the film 1. Useful laser wavelengths are 248 nm from a KrF laser, or a wavelength of 308 nm from an XeCl laser, or a wavelength of 351 nm from an XeF laser.

Apart from the inclusion and use of the scattered light detector 22, the laser apparatus of FIG. 1 may be similar to that described in U.S. Pat. No. 5,372,836 and/or in the Journal article "Beam Shape Effects with Excimer Laser Crystallisation of Plasma Enhanced and Low Pressure Chemical Vapour Deposited Amorphous Silicon" by S D Brotherton, D J McCulloch et al in Solid State Phenomena, Vols 37 to 38 (1984), pages 299 to 304. The whole of this Solid State Phenomena article are hereby incorporated herein as reference material.

Thus, the laser apparatus of FIG. 1 comprises an electrical power supply 81 for the laser 100. The power supply 81 is regulated by a computer control system 80. The computer control system 80 also regulates the movement of an X-Y table 52 for scanning the laser beam 11 along the surface of the thin film 1. In the arrangement illustrated by way of example in FIG. 1, the X-Y table 52 moves the substrate 10, although an arrangement as illustrated in U.S. Pat. No. 5,372,836 may be used in which an X-Y table moves an optical element to move the laser beam 11. In the example illustrated in FIG. 1, the substrate support 51 is a susceptor which is mounted on the X-Y table 52. The position of the X-Y table 52 is controlled by an input signal from the computer control system 80. The processing cell 50 may be, for example, a vacuum chamber.

The optical system 101 to 103 between the laser 100 and the processing cell 50 may comprise an attenuator 101, an homogeniser 102 for controlling the beam shape, and one or more total-reflection mirrors 103 for deflecting the beam 11.

Typically the optical system 101 to 103 also comprises other optical elements, for example one or more apertures and lenses. The attenuator 101 controls the energy of the beam 11 transmitted from the laser 100 to the processing cell 50. This attenuator 101 may be of known form, for example one or more tilting transmission plates, the angle of which is varied to vary the transmitted energy level. The angle of the plates is set in known manner by an output signal from the computer control system 80.

The apparatus may comprise a spectroscope 30 for generating band-gap spectroscopic reflectance distributions as illustrated in FIGS. 18 to 21 of U.S. Pat. No. 5,372,836. However, most importantly, the apparatus comprises the scattered light detector 22 which is provided and used in accordance with the present invention. Thus, the light detector 22 provides its output to the computer control system 80. The computer control system 80 then sets the energy of the beam 11 to a value (E+dE) as determined by the detection of a threshold increase in the scattered light 26. This change in the energy of the beam 11 may be effected via an output signal from the computer control system 80 to the electrical power supply 81 of the laser 100. However, it is preferable not to disturb the electrical supply to the laser 100 during its operation. Therefore, it is preferable to change the energy of the beam 11 by the computer control system 80 providing an output to the attenuator 101.

The light 21 which is directed at the surface of the crystallised thin-film portion 2 may be from a light source 20 independent of the beam 11 used for crystallising the thin-film portion 2. The wavelength of the scattered light 26 may therefore be made quite different from that of the laser beam 11, so that the light detector 22 can readily respond to the scattered light 26 from source 20, in distinction from any returning light from the laser beam 11. The light 21,26 may be of an ultraviolet wavelength, for example at about 325 nm when the laser beam 11 is at 248 nm. A filter and shutter arrangement 23 and 24 may be present in front of each of the light source 20 and light detector 22 to determine the wavelength and timing of the light transmission from the source 20 to the detector 22. The scattered light detector 22 may be of any convenient type, for example a photodiode.

However, instead of using a separate light source 20 with the detector 22, the laser beam 11 used for crystallising the thin-film portion 2 may provide the light 26 which is scattered to the light detector 22 for monitoring the surface quality. Beam 11 may have a spatial energy distribution (for example a Gaussian distribution in the scan direction) comprising a peak energy rising from a leading edge of increasing energy and falling off in a trailing edge of reducing energy. The energy regulation achieved in accordance with the present invention may be such that the peak energy value is just sufficient to achieve melt-through of the film thickness; in this case, the trailing edge of reducing energy allows the crystallisation of smaller grains as nuclei for large grain growth in the film 1, which may be even more optimum for providing high electron field-effect mobilities. Furthermore, the leading and trailing edges permit the laser beam 11 to be used in monitoring the crystallisation quality of the cooling film 1 after melt-through. Thus, with a pulsed laser beam 11, the leading edge of the next pulse provides the incident light which is scattered as light 26 to the detector 22 from the surface of the cooling film portion 2 which has crystallised after melt-through by the previous pulse. In this case, for example, the beam 11 and hence also the scattered light 26 may have a wavelength of 308 nm. The increasing energy in the leading edge of such a pulse is also advantageous in achieving a gradual release of hydrogen in the laser crystallisation of a hydrogen-rich PECVD a-Si:H film 1 as described in the said Solid State Phenomena article. However, a shaped beam having such a spatial energy distribution may also be used to crystallise silicon films having substantially no damaging hydrogen content.

Figure 4:
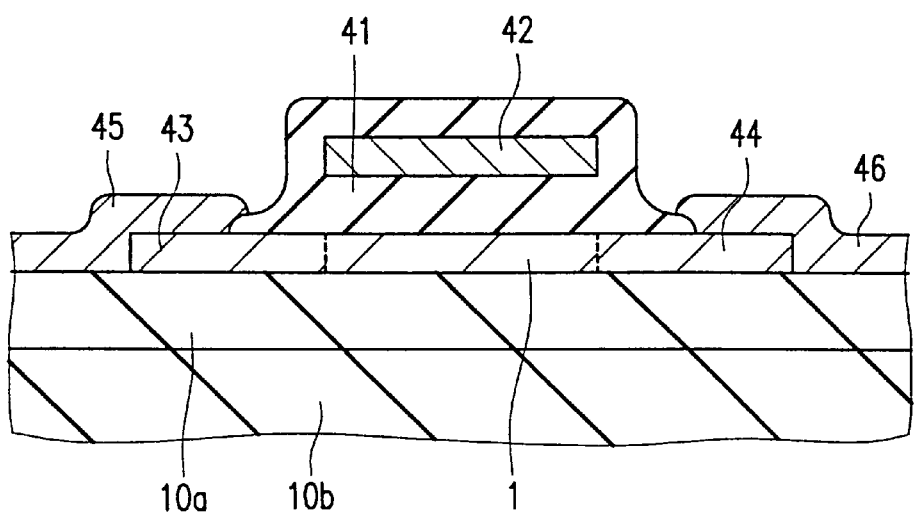
FIG. 4 is a cross-section view of one example of a TFT fabricated with a film portion crystallised in a method in accordance with the invention.

The present invention may be used to optimise crystal grain size and field-effect mobility in polycrystalline silicon films for thin-film circuit element fabrication in known types of large-area electronic device. By way of example, the experimental results illustrated in FIGS. 5 and 6 were obtained by fabricating so-called "top-gate co-planar polysilicon TFTs" similar to the TFT shown in FIG. 6 of U.S. Pat. No. 5,130,829. Such a top-gate co-planar polysilicon TFT is illustrated in FIG. 4. The gate electrode 42 is present on a gate dielectric film 41 on a crystallised portion of the thin-film 1 which provides the channel region of the TFT. Doped source and drain regions 43 and 44 are formed in the film 1 and contacted by metal film electrodes 45 and 46. Such TFTs may form the switching elements of an array of a display matrix as described in U.S. Pat. No. 5,130,829. However, they may also form circuit elements in row and column driver circuits integrated on the same substrate 10 as the display array.

By way of example, FIG. 3 shows in plan view a thin film 1 on a substrate 10 which is subsequently divided into four display components by scribing along the lines M—M, M'—M', and N—N. Each display component comprises an array area 5 bordered on two sides by a row driver circuit area 4 and a column driver circuit area 3. The whole of the thin film 1 (i.e areas 3, 4 and 5) may be crystallised with the laser beam 11. However, if desired, the array area 5 may be retained as amorphous silicon material and only the column and row driver circuit areas 3 and 4 may be crystallised with the beam 11. The arrangement illustrated in FIG. 3 also comprises a test surface area 2 which is a peripheral area of the semiconductor thin film 1 on the substrate 10. This test area 2 is part of the same semiconductor thin film 1 as the device portions 3, 4 and 5. In this case, the method of manufacture includes the steps of directing the beam 11 at the test area 2 in step (a), regulating the energy of the beam 11 to the set value by monitoring the quality of the crystallised test surface area 2 by means of the scattered light 26 in step (b), and then directing the beam 11 with the set value of energy at the different surface areas 3, 4 and/or 5 to crystallise these different portions for the thin-film circuit elements of the display components.

Figure 5:
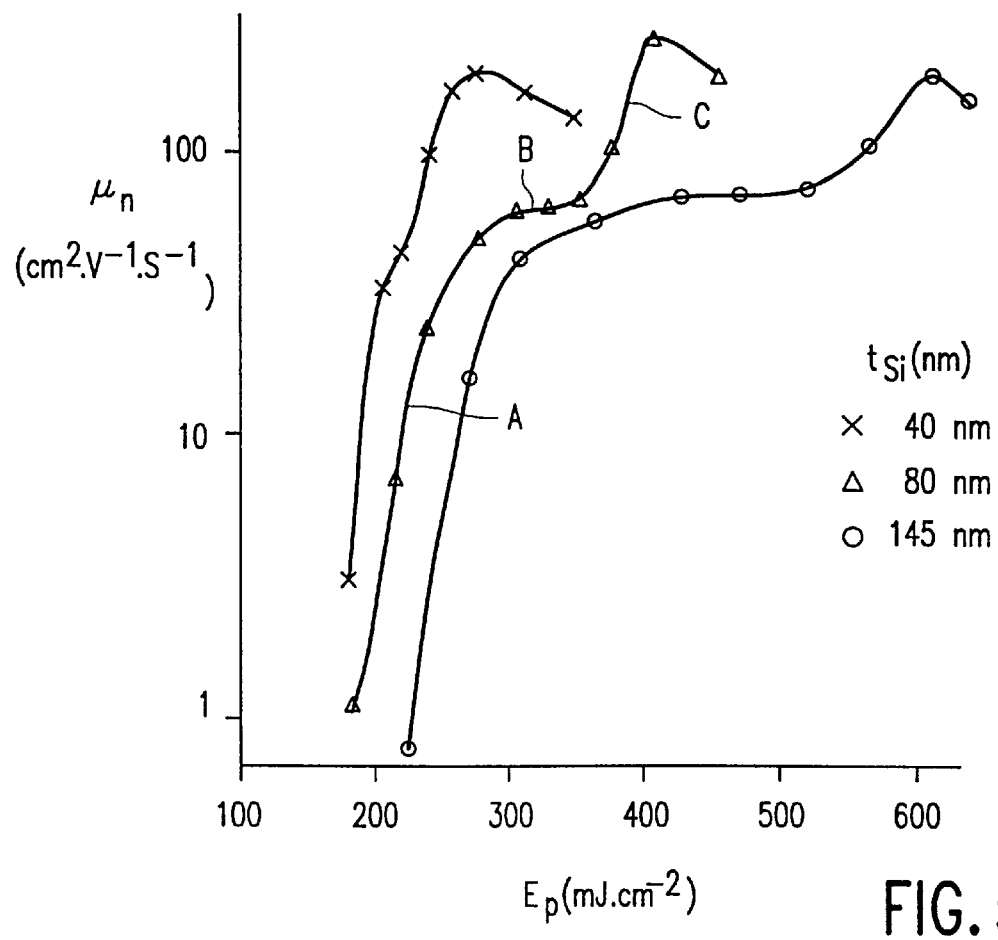
FIG. 5 is a graph of electron mobility ($\mu_n$) in $cm^2 \cdot V^{-1} \cdot s^{-1}$ in a crystallised film portion, as a function of peak laser energy ($E_p$) in $mJ \cdot cm^{-2}$ per pulse for different film thicknesses ($t_{Si}$) in nm.
Figure 6:
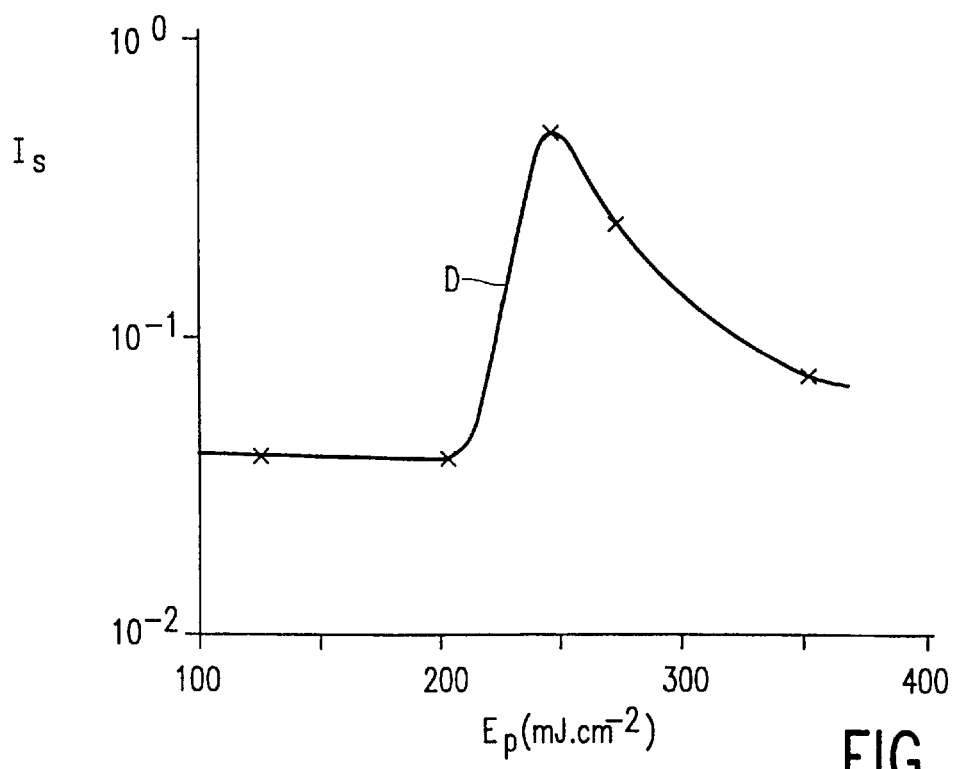
FIG. 6 is a graph of scattered light intensity $I_s$ in arbitrary units as a function of peak laser energy ($E_p$) in $mJ \cdot cm^{-2}$ per pulse for a film thickness $t_{Si}$ of 40 nm.

The present invention may be used to crystallise semiconductor thin films 1 having a hydrogen content. However, as described in the Applied Physics Letters article and the Solid State Phenomena article, the release of hydrogen from the film when scanned with a laser beam can result in significant surface roughening. In order to illustrate the different surface roughening mechanism which is utilised in accordance with the present invention, it is preferable to avoid any confusion with surface roughening caused by hydrogen release. For this reason, the experimental results given in FIGS. 5 and 6 are for a semiconductor thin film of a silicon material which has substantially no hydrogen content at least when crystallising the device portion 3,4,5 of the thin film 1 for the thin-film circuit elements. The film 1 may be deposited by PECVD (plasma enhanced chemical vapour deposition) with a hydrogen content which may be slowly released by gradual heating before carrying out any laser crystallisation treatment. However, the thin film 1 may be deposited by LPCVD (low pressure chemical vapour deposition) with only a very low hydrogen content. In the case of FIGS. 5 and 6, the pre-cursor films 1 crystallised by the beam 11 were deposited as amorphous silicon LPCVD layers at 540° C. The substrate 10 comprised a glass plate 10b capped with an insulating layer 10a of silicon dioxide. The silicon film 1 was deposited on this insulating layer 10a. For the results of FIGS. 5 and 6, a gate dielectric 41 of silicon dioxide was deposited to a thickness of 140 nm in a PECVD reactor at 300° C. A TFT having an aluminium gate 42 and the co-planar configuration illustrated in FIG. 4 was formed with the crystallised film 1. The silicon film 1 is patterned by etching into individual islands for the individual TFTs and any other thin-film circuit elements of the device.

The peak energy $E_p$ given in FIGS. 5 and 6 is the peak energy occurring within a semi-Gaussian distribution for the beam 11, for example as described in the Solid State Phenomena article. $E_p$ is the peak energy density in mJ·cm$^{-2}$ for each pulse of the beam 11. Typically the pulse duration is about 30 ns (nanoseconds). The device portions of the film 1 were subjected to approximately 140 pulses to obtain the mobility results shown in FIG. 5.

FIG. 5 shows the variation of electron field effect mobility ($\mu_n$) with both the incident peak energy ($E_p$) in each laser pulse and with the thickness ($t_{Si}$) of the LPCVD pre-cursor film 1. There is a clear pattern to these mobility results. In region A there is an initial increase in mobility (and its saturation in region B at 40 to 60 cm$^2$·V$^{-1}$·S$^{-1}$) which arises from the primary conversion of the surface of the amorphous silicon film 1 to polycrystalline silicon. Under these conditions, the crystallised film 1 appears to be stratified with an upper layer of grains about 100 nm wide on a finer grain background. In region C there is a second increase in mobility which arises as the melt-through condition is approached. The energies required for melt-through are strongly dependent on the film thickness $t_{Si}$. Over the range of thicknesses shown, the melt-through threshold voltage varied approximately linearly with film thickness $t_{Si}$. TEM (transmission electron microscope) investigation of these films in the region C has shown both an increase of 2 to 3 times in grain size and an absence of stratification in samples having the peak mobility. The peak mobility was about 175 cm$^2$·V$^{-1}$·s$^{-1}$ for the 40 nm thick film 1, and in excess of 200 cm$^2$·V$^{-1}$·s$^{-1}$ for the 80 nm thick film 1. The mobility is observed to fall off after these peak values, apparently due to the onset of crystallographic damage in the film as a result of an excessive energy of the beam 11.

The transition from saturation region B to the second increasing region C is well defined for the films 1 with thicknesses $t_{Si}$ of 80 nm and 145 nm. This transition from regions B to C is not so clear in FIG. 5 for the film 1 having a thickness of 40 nm. However, the occurrence of a related transition can be seen quite clearly by examining the scattered light 26 from the 40 nm thick film 1, as illustrated in FIG. 6. Thus, FIG. 6 shows that there is an order of magnitude increase D in the scattered light 26 as a characteristic surface roughening of the film occurs before melt-through. This threshold increase D in scattered light 26 is easily detected with the light detector 22. The results shown in FIG. 6 were for light 21,26 of 325 nm wavelength. A pulsed laser beam of 248 nm was used for the crystallisation of the film 1.

This onset of surface roughening seems to be related to the appearance of a periodic spatially varying roughness as described and shown in the said Applied Physics Letters article. It should be noted that there is a reduction of only a few percent in the reflected light 25 from the film surface as this roughening occurs. This small change in surface reflectance provides inadequate sensitivity for reliably monitoring the occurrence of this onset. By contrast therewith, there is an order of magnitude increase in the scattered light 26 as this onset occurs.

It should also be noted that the energy E at which the onset of surface roughening occurs (as detected by this threshold increase D in scattered light 26) is at a lower value than the optimum beam energy for maximum film mobility as shown in FIG. 5. Generally speaking, for a semiconductor thin film of silicon having a thickness in the range of 20 nm to 60 nm, this optimum beam energy is within 60 mJ·cm$^{-2}$ of the value E causing the onset of surface roughening as detected by the threshold increase D in intensity of the scattered light 26. Thus, for example, for the 40 nm thick film 1 the threshold increase D in scattered light intensity as shown in FIG. 6 occurs between 225 and 240 mJ·cm$^{-2}$. The optimum beam energy for maximum field-effect electron mobility as illustrated in FIG. 5 occurs at about 270 mJ·cm$^{-2}$. Therefore, the energy of the beam 11 used for crystallisation of device portions 3,4, and/or 5 of the film 1 in step (c) is preferably set to a regulated value which is about 25 mJ·cm$^{-2}$ higher than the energy threshold indicated in FIG. 6. Thus, for maximum film mobility, the energy of the beam 11 is set to a value of (E+dE), where E is the energy at which the particular onset of surface roughening is detected by the scattered light detector 22 as illustrated in FIG. 6, and where dE is an incremental increase which is found by the present inventors to be dependent on the thickness $t_{Si}$ of the thin film 1 and which is thus also related to the energy value E. For film thicknesses $t_{Si}$ of less than 40 nm the set value (E+dE) converges rapidly towards E, whereas for thicker films 1 the incremental increase dE increases strongly as the thickness $t_{Si}$ increases. Thus, the incremental increase dE is nearly 150 mJ·cm$^{-2}$ for a film thickness of $t_{Si}$ of 80 nm. The films 1 required for most TFTs and other thin-film circuit elements of large-area electronic devices today have film thicknesses of less than 50 nm, and the general trend is towards even thinner films, for example 40 nm, 30 nm and less. The value of the incremental increase dE (to be added to the scattered-light monitored value E so as to set the beam energy for optimum crystal growth) can be stored in a look-up table of the computer control system 80.

From reading the present disclosure, many modifications and variations will be apparent to persons skilled in the art. Such modifications and variations may involve equivalent features and other features which are already known in the art and which may be used instead of or in addition to features already disclosed herein. Although claims have been formulated in this Application to particular combinations of features, it should be understood that the scope of the disclosure of the present application includes any and every novel feature or any novel combination of features disclosed herein either explicitly or implicitly and any generalisation thereof, whether or not it relates to the same invention as presently claimed in any claim and whether or not it mitigates any or all of the same technical problems as does the present invention. The Applicants hereby give notice that new claims may be formulated to such features and/or combinations of such features during prosecution of the present application or of any further application derived therefrom.

What is claimed is:

1. A method of manufacturing an electronic device comprising a thin-film circuit element, which method includes the steps of:

(a) directing an energy beam at a surface area of a semiconductor thin film on a substrate to crystallise at least a portion of the thin film, (b) monitoring the surface quality of the crystallised portion of the thin film by directing light at the surface area of the crystallised portion and by detecting with a light detector the light returned by the surface area, the light detector giving an output indicative of the monitored surface quality, and (c) setting the energy of the beam in accordance with the output from the light detector to regulate the crystallisation of a device portion of a semiconductor thin film at which the beam is subsequently directed with its set energy, characterised in that the light detector is located at a position outside the specular reflection path of the light returned by the surface area of the crystallised portion and detects a threshold increase in intensity of the light being scattered by the surface area of the crystallised portion, which threshold increase occurs when the energy of the beam is increased sufficiently to cause an onset of surface roughening, and in that, when crystallising the device portion for the thin-film circuit element during the step (c), the energy of the beam is set to a value as determined by the detection of said threshold increase.

2. A method as claimed in claim 1, further characterised in that the portion crystallised in step (a) is a part of the same semiconductor thin film as the device portion subsequently crystallised with the beam of set energy in step (c).

3. A method as claimed in claim 2, further characterised by the steps of directing the energy beam at a test surface area of the semiconductor thin film in step (a), changing the energy of the beam to the set value by monitoring the quality of the crystallised test surface area by means of the scattered light in step (b), and directing the energy beam with the set value of energy at a different surface area of the semiconductor thin film to crystallise the device portion for the thin-film circuit element.

4. A method as claimed in claim 3, further characterised in that the test surface area is a peripheral area of the semiconductor thin film.

5. A method as claimed in claim 1, further characterised in that the light which is directed at the surface area of the crystallised portion is from a light source independent of the beam used for crystallising the thin-film portion.

6. A method as claimed in claim 1, further characterised in that the beam used for crystallising the portion of the thin film is from a laser and provides also the light which is scattered to the light detector for monitoring the surface quality in step (b).

7. A method as claimed in claim 1, further characterised in that the semiconductor thin film is of silicon having a thickness in the range of 20 nm to 60 nm, and in that the set value of the energy of the beam used for crystallisation in step (c) is within 60 mJ·cm$^{-2}$ of the value causing the onset of surface roughening as detected by the threshold increase in intensity of the light being scattered by the surface area of the crystallised portion.

8. A method as claimed in claim 1, further characterised in that the semiconductor thin film is of a silicon material which has substantially no damaging hydrogen content at least when crystallising the device portion of the thin film for the thin-film circuit element during the step (c).

9. Apparatus for crystallising a portion of a semiconductor thin film on a substrate comprising a laser for generating an energy beam to crystallise the portion of the thin film, a processing cell containing a support for mounting the substrate, an optical system between the laser and the processing cell to direct the beam from the laser at a surface area of the thin film when the substrate is mounted in the processing cell, adaptor means for changing the energy of the beam incident on the film, a light source for directing light at the surface area of the crystallised portion of the thin film, and a light detector for detecting the light returned by the surface area, the light detector giving an output indicative of the surface quality, characterised in that the light detector is located at a position outside the specular reflection path of the light returned by the surface area of the crystallised portion and has sufficient sensitivity to detect a threshold increase in intensity of the light being scattered by the surface area of the crystallised portion, which threshold increase occurs when the energy of the beam is increased sufficiently to cause the onset of surface roughening, and control means take an input from the output of the light detector and provide an output to the adaptor means for setting the energy of the beam to a value as determined by the detection of said threshold increase.

10. Apparatus as claimed in claim 9, further characterised in that the adaptor means is an attenuator which is located in the path of the beam, and which forms part of the optical system between the laser and the processing cell.

11. A method as claimed in claim 2, further characterised in that the light which is directed at the surface area of the crystallised portion is from a light source independent of the beam used for crystallising the thin-film portion.

12. A method as claimed in claim 3, further characterised in that the light which is directed at the surface area of the crystallised portion is from a light source independent of the beam used for crystallising the thin-film portion.

13. A method as claimed in claim 4, further characterised in that the light which is directed at the surface area of the crystallised portion is from a light source independent of the beam used for crystallising the thin-film portion.

14. A method as claimed in claim 2, further characterised in that the beam used for crystallising the portion of the thin film is from a laser and provides also the light which is scattered to the light detector for monitoring the surface quality in step (b).

15. A method as claimed in claim 3, further characterised in that the beam used for crystallising the portion of the thin film is from a laser and provides also the light which is scattered to the light detector for monitoring the surface quality in step (b).

16. A method as claimed in claim 4, further characterised in that the beam used for crystallising the portion of the thin film is from a laser and provides also the light which is scattered to the light detector for monitoring the surface quality in step (b).

17. A method as claimed in claim 6, further characterised in that the semiconductor thin film is of silicon having a thickness in the range of 20 nm to 60 nm, and in that the set value of the energy of the beam used for crystallisation in step (c) is within 60 mJ·cm$^2$ of the value causing the onset of surface roughening as detected by the threshold increase in intensity of the light being scattered by the surface area of the crystallised portion.

18. A method as claimed in claims 17, further characterised in that the semiconductor thin film is of a silicon material which has substantially no damaging hydrogen content at least when crystallising the device portion of the thin film for the thin-film circuit element during the step (c).

19. A method as claimed in claims 7, further characterised in that the semiconductor thin film is of a silicon material which has substantially no damaging hydrogen content at least when crystallising the device portion of the thin film for the thin-film circuit element during the step (c).

* * * * *